United States Patent [19]

Kovach

[11] Patent Number: 4,543,530
[45] Date of Patent: Sep. 24, 1985

[54] METHODS OF AND MEANS FOR DETERMINING THE TIME-CENTER OF PULSES

[75] Inventor: John P. Kovach, Euless, Tex.

[73] Assignee: Del Norte Technology, Inc., Euless, Tex.

[21] Appl. No.: 407,312

[22] Filed: Aug. 11, 1982

[51] Int. Cl.⁴ .................... H03K 5/153; G01R 29/027
[52] U.S. Cl. .................................. 328/108; 307/517; 307/234; 307/273
[58] Field of Search ............... 307/234, 362, 273, 517, 307/518, 593, 595, 602, 608; 328/111, 115, 109, 185, 114

[56] References Cited

U.S. PATENT DOCUMENTS 4,281,262  7/1981  Dressen .............................. 307/234

Primary Examiner—John Zazworsky
Attorney, Agent, or Firm—Louis Bernat

[57] ABSTRACT

A pulse position detector responding to the leading and trailing edges of a pulse at a point where it crosses a threshold level. Responsive to the leading edge, a capacitor begins to charge with a characteristic which is represented by a slope of a first line. Responsive to the trailing edge of pulse, the capacitor begins to charge at a second rate which is represented by a second line having a slope which is twice the slope of the first line. An one-shot multivibrator responds to the change in the charge rate to measure a time period which depends upon the slopes of the two lines. That time period is substracted from a standard time period in order to indicate where the center of the pulse appeared.

1 Claim, 4 Drawing Figures

METHODS OF AND MEANS FOR DETERMINING THE TIME-CENTER OF PULSES

This invention relates to pulse position detectors and more particularly to methods of and means for detecting the exact positions of the centers of electronic pulses, and especially of radar pulses.

There are many times and places for use of a means for detecting and measuring the exact center of an electrical pulse. An example of one such usage is found in radar ranging and measuring systems. There a radar pulse is sent to and returned from a distant target. The distance to the target is calculated from the time required for the round trip of the pulse. Hence, it is quite obvious that the accuracy of the radar system is no better than the accuracy of the pulse position detection.

Conventional methods of and means for measuring the position of a pulse is to manually center it on the face of a cathode ray tube. This need for a manual pulse position measurement is limiting because it is time consuming and because it requires an expensive human intervention. Therefore, newer systems build in an automatic reading means. Usually, this automatic reading involves threshold detecting which indicates when the level of the pulse exceeds the threshold. However, there are two troubles with this threshold approach. First, the pulse shape becomes distorted so that the edge of the pulse may not retain its original rise time relationship and, therefore, the pulse appears to have moved. Second, this pulse detection technique becomes unreliable when the pulse level is only marginally greater than the level of the back ground noise. Thus, there are two criteria for detecting a pulse position. The first is to detect the amplitude of a pulse and the second is to reject the background noise.

In the past, one method was to save prior pulse amplitude information and then to set a lower level for the next subsequent pulse. The trouble with this system is that the pulse becomes only marginally stronger than the noise. Then, random atmospherical or similar noise can trigger a pulse detection.

Another approach is to provide some kind of a time filter which limits the response to the time period of the expected reply pulse. See, for example, Huckabay U.S. Pat. No. 3,181,155, Merrick U.S. Pat. No. 3,918,056 and Dano U.S. Pat. No. 3,938,146. This type of time filtering system yields an improvement of 3 to 6 dB over the older and less sophisticated threshold detectors. However, these systems are still triggered by ambient noise which occurs within the time window. Moreover, while these systems do detect the presence of a pulse during a time window, they do not precisely position the pulse within that window. Also, pulse position jitter may be caused by any noise which is superimposed upon a pulse having a level which is near the threshold level. The prior systems attempted to overcome these and similar problems by storing and averaging a large number of pulses.

When attempts were made to locate the pulse precisely, it has been conventional to trigger a circuit responsive to a leading edge of the pulse. However, random noise added to the pulse cause a variance in the rise time of the detected pulse. This rise time variance, in turn, caused an error in the perceived time of pulse reception. The importance of this variation is apparent when one stops to realize that modern electronic systems require nanosecond accuracy. For example, if operating at a 10 MHz bandwidth, a rise time uncertainty of 50 nanoseconds (which is quite common) causes a commercially unacceptable loss of accuracy.

Accordingly, one object of this invention is to provide new and improved means for and methods of precisely locating the time position of electronic pulses. Here, an object is to provide means for precisely locating the time positions of returning radar pulses.

Another object of the invention is to provide improved, jitter-free radar systems.

Still another object of the invention is to provide means for and methods of identifying and of locating the time position of the centers of electronic pulses.

In keeping with an aspect of the invention, these and other objects are accomplished by a pulse position detector responding to the leading and trailing edges of a pulse at points where those edges cross a threshold level. Responsive to the leading edge of a pulse, a capacitor begins to charge with a characteristic which is represented by a slope of a first line. Responsive to the trailing edge of that pulse, the capacitor begins to charge at a rate which is represented by a second line having a slope which is twice the slope of the first line. An one-shot multivibrator measures a time period which depends upon the slopes of the two lines. That time period is substracted from a standard time period in order to indicate where the center of the pulse appeared.

A preferred embodiment of the invention is shown in the attached drawings wherein.

Figure 1A:
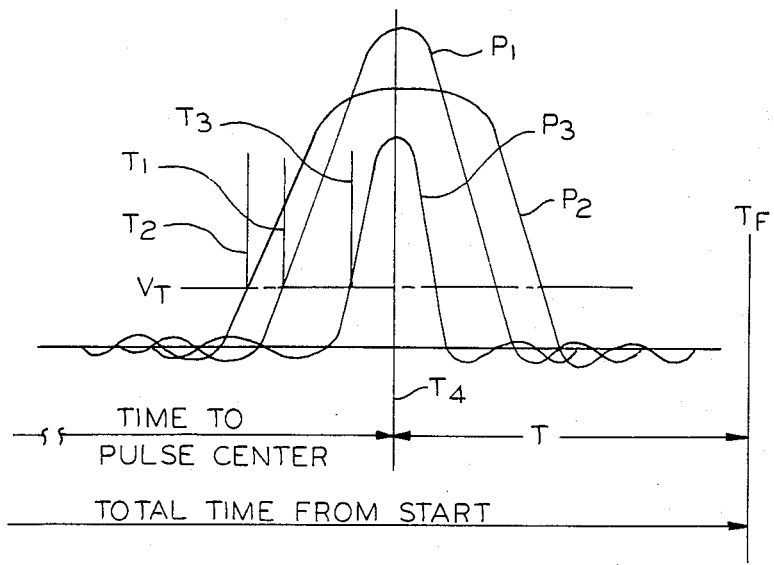
FIGS. 1A and 1B are graphs which show how and explain why noise caused pulse shape distortion does not affect the position at the center of a pulse.

In FIG. 1A, it is for purposes of explanation assumed that pulse $P_1$ is the form and shape of an electronic pulse, as originally transmitted. It may be that the original pulse $P_1$ is attenuated somewhat and picks up noise in transit, which lowers and broadens the pulse to become the shape of pulse $P_2$. Or, perhaps, the pulse is greatly attenuated to have a much lower amplitude and narrower width (see Pulse $P_3$). If the detector is tripped by a leading edge, the same pulse $P_1$ trips at time $T_1$, the broader pulse $P_2$ trips at time $T_2$, and the energy dissipated pulse $P_3$ trips at time $T_3$. Observe, however, that all three pulses remain centered on the line $T_4$. This is because, statistically, each pulse will gain or lose approximately the same amount of energy on each side of the center.

Figure 1B:
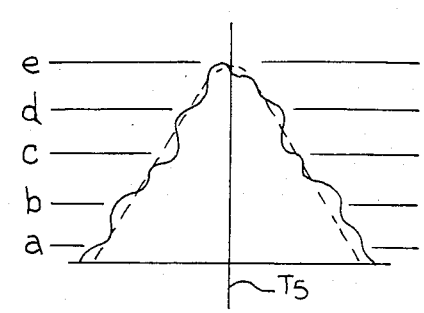

In reality, pulses do not often have such a symmetrical pulse shape distortion. For example, the solid line in FIG. 1B is a purely randomly drawn pulse, with no attempt to represent anything specific which might occur. The original pulse is shown by dashed lines. The characteristics of a pulse are such that the same events have an influence on both the leading and the trailing edges of the pulse. Thus, at level "a," both sides of the pulse are expanded somewhat. Likewise, at each of the other levels b–e, there are events which tend to widen or narrow the pulse (the solid line) from its nominal shape (the dashed line). As a result, the energy content of the pulse on both sides of the center line $T_5$ remains approximately equal.

Accordingly, regardless of whether the returning pulse looks like pulses $P_1$, $P_2$, $P_3$ or the pulse of FIG. 1B, the energy in each pulse is more or less uniformly distributed on opposite sides of the center line.

Figure 2:
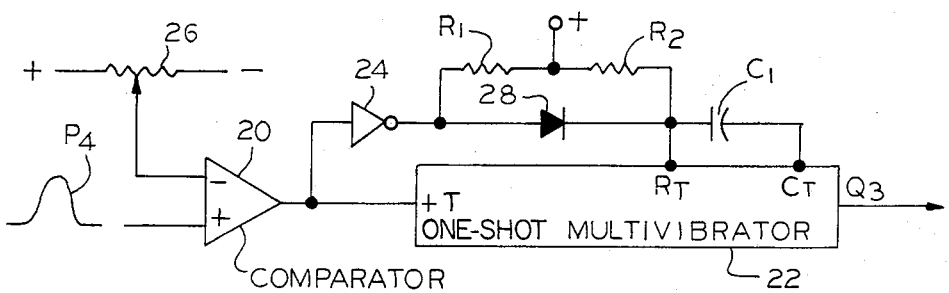
FIG. 2 is a circuit diagram which shows a pulse center position detector.

FIG. 2 shows a circuit for appraising the energy content on the opposite sides of the center line of a pulse. In greater detail, the major components in the circuit of FIG. 2 are a conventional comparator 20, a one-shot multivibrator 22, and an inverter 24. The comparator 20 is controlled by a reference voltage selected by an adjustment of a potentiometer 26. Comparator 20 has an output when the voltage of an input pulse P4 rises to a voltage at the (+) terminal which is higher than the reference voltage at the (−) terminal.

The output of the comparator 20 instantly triggers the one-shot multivibrator 22. The multivibrator 22 automatically produces an output pulse, of known shape and energy, at the output terminal $Q_3$, the pulse shape being set by the resistance values $R_1$, $R_2$ and the capacitance value $C_1$. As the comparator 20 conducts, the output of inverter 24 goes to ground to remove a bias normally applied through resistor $R_1$ to diode 28 and to apply a reverse bias thereto. As a result, diode 28 is reverse biased and cannot conduct for the entire time period while pulse P4 and any accompanying noise exceeds the reference voltage set by potentiometer 26. As a result, the entire voltage at point $R_T$ is set by current from the positive terminal (+) through resistor $R_2$ to the point $R_T$, which is the integrator junction of the multivibrator 22.

Figure 3:
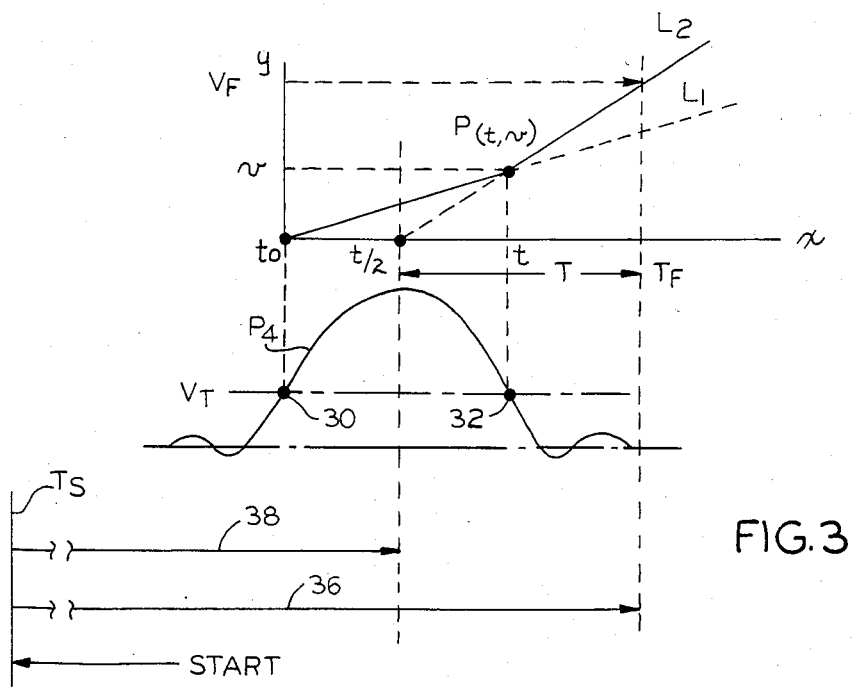
FIG. 3 is a timing graph which helps explain the operation of the circuit of FIG. 2.

The resulting voltage change at terminal $R_T$ is represented by the low-slope-rate of line $L_1$, FIG. 3.

When the voltage level of input pulse P4 falls below the threshold of the reference voltage set by potentiometer 26, comparator 20 switches off, and inverter 24 removes the reverse bias from diode 28. Current from the positive source (+) through resistor $R_1$ adds to the current through resistor $R_2$. There is a prolonged period set by the recovery time of the capacitor $C_1$ which accelerates the timing of the one-shot multivibrator 22, until the one-shot period completely returns to normal. The cycle is complete when the voltage at terminal $Q_3$ reaches normal.

The voltage time relationships are seen in FIG. 3, which is based on a pulse P4 that triggers the comparator 20. It is assumed that the reference voltage set by potentiometer 26 is such that the comparator 20 conducts whenever the level of pulse P4 is higher than $V_T$.

From conventional analytical geometry, the slopes of lines $L_1$ and $L_2$ of FIG. 3 are represented by:

$$L_1, y = M_1 x + b_1 \quad (1)$$

and $$L_2, y = M_2 x + b_2 \quad (2)$$

where $$M_2 = 2M_1 \quad (2a)$$

If it can be proven that the x axis intercept of line $L_2$ is exactly one-half of the distance between points 30, 32 where pulse P4 crosses the threshold level, then it is obvious that the center line of the pulse has been found.

All timing starts with the time position $t_o$ (i.e. point 30) when the voltage of pulse P4 first exceeds the threshold level $V_T$. For line $L_1$, at time $t_o$: $x=0$, $y=0$, $B_1=0$. From equation (1), $y=M_1x$ or $M_1=y/x$. Since the y axis measures voltage "v" and x measures time "t", $M_1=V/t$.

When Pulse P4 returns to the threshold level $V_T$ (i.e. point 32), diode 28 is no longer reversely biased and the slope $L_2$ changes to some steeper value while additional current passes through resistor $R_1$, the point of change being the point P(t, v).

Since $M_1=V/t$, then from 2a $$M_2 = 2M_1 = 2v/t \quad (3)$$

Therefore, it is necessary to find the equation of a line $L_2$ having the slope of $2M_1$ which intersects $L_1$ at the point p(t,v). From equation 2, and substituting the value $M_2=2M_1=2(v/t)$; by substitution using Equation (2), we find that $y=2(v/t)t+b_2$.

Solving this equation for the v intercept which lies on the y axis, we get $$b_2 = -v \quad (4)$$

By substituting equation 4 into equation 2, we get $$y = M_2 x - v \quad (5)$$

Since the point $P_{(t, v)}$ lies on both of the lines $L_1$ and $L_2$, equations 3 and 5 may be combined to give:

$$x = (y+v)/M_2 = (ty+tv)/2v \quad (6)$$

If we examine equation 6 to find the theoretical starting point of $L_2$, we can set $y=0$. Therefore, $x=t/2$, which divides the pulse P4 in half.

The slope of line $L_2$ is a constant which always climbs to a level $V_F$ where an event signal may be generated. The time required for a generation of the signal represented by line $L_2$ is equal to the time T. If there is any starting time $T_S$, the time elapsing before the event generated by level $V_F$ is represented by line 36. If the time T is substracted from line 36, the time position of the center of the line of the pulse P4 is represented by the line 38. The length of line 38 is independent of variations in both the height and the width of the pulse P4.

The operation of the FIG. 2 circuit should now be obvious. At some start time, $T_S$, a suitable time measuring device begins measuring time. When the voltage of pulse P4 rises above the level $V_T$, comparator 20 conducts and the inverter 24 reversely biases diode 28 to prevent any current from (+) battery through resistor $R_1$, and diode 28 to capacitor $C_1$ and to the terminal $R_T$. Capacitor $C_1$ charges at a rate represented by the slope of line $L_1$. Also, when comparator 20 conducts, its output instantly triggers the one-shot multivibrator 22. The multivibrator output at terminal $Q_3$ changes when the comparator 20 conducts and returns to the original state with a timing set by the RC characteristics of resistors $R_1$, $R_2$ and capacitor $C_1$.

When the voltage of pulse P4 returns to the threshold $V_T$ set by potentiometer 26, the comparator 20 output terminates and the inverter 24 removes the reverse bias from diode 28 and current appears in resistor $R_1$. The capacitor $C_1$ receives an increased charging current via both resistors $R_1$, $R_2$ in parallel, and therefore, charges at a rate represented by the slope of line $L_2$. Thereafter, the one-shot multivibrator 22 holds its output voltage at the terminal $Q_3$ beginning with the conduction of added current through diode 28 and continuing until time $T_F$.

Then, the one-shot multivibrator switches itself off to terminate the operation.

The slope of the line $L_2$ indicates the time required to charge capacitor $C_1$ and determines how long it will take for the one-shot multivibrator output to return to normal. As noted above the position of the intersection point $P_{(t, v)}$ of the two lines $L_1$, $L_2$ varies with the pulse width at the $V_T$ intercept points 30, 32, but the slope of line $L_2$ depends only on the circuit values of resistors $R_1$, $R_2$, and capacitor $C_1$. Therefore, for a very narrow pulse $P_3$, point $P_{(t,v)}$ comes sooner; for a very wide pulse $P_2$, it comes later. The effect is to shift a line $L_2$, with a constant slope, to the left or right. Since the slope is always constant and since the one-shot multivibrator 22 always switches responsive to the same voltage level charge on capacitor $C_1$, it is obvious that the time of a pulse always has the same relationship with respect to the time center of the activating pulse P4 of FIG. 3. Time $T_F$ is the end of a cycle of the circuit.

Therefore, it is easy to measure a time period 36 and to substract a standard time period T, which leaves the sought after time period 38, or an indication of the time when the center of the pulse occurs. Since a pulse tends to remain symmetrical around its center line, the pulse is detected at the time of its most reliable characteristic, even when its shape is badly distorted, as in FIG. 1B. If it is assumed that the dashed line in FIG. 1B is the true shape of the transmitted pulse, the center line $T_5$ has not shifted at all as a result of the shape distortions of the solid line. However, if the solid line represents the received pulse shape, it is obvious that the detected pulse position would be too soon if tripped by the leading edge at level b, or too late if tripped by the trailing edge at level b. If the detector is tripped by the leading edge at level c, the pulse would be detected too late; or, if tripped by the trailing edge at level c, the correct position would be detected. When tripped at the center line $T_5$, the true pulse position is found at all levels.

Those who are skilled in the art will perceive various modifications which may be made in the described structure; therefore, the claims are to be construed to cover all equivalent structures which fall within the true scope and spirit of the invention.

I claim:

1. A pulse center detector comprising a two input comparator having a reference voltage applied to one of said inputs and a pulse applied to the other of said inputs, said comparator having an output signal beginning when the voltage of said pulse rises above a threshold set by said reference voltage and ending when the voltage of said pulse falls below said threshold, a one-shot multivibrator having a time constant controlled by a capacitor, two parallel paths for controlling the charging of said capacitor, switch means responsive to the output signal of said comparator for opening and closing one of said two paths, said capacitor initially charging at one rate responsive to the operation of said switch means during said output signal and completing said charging at twice said one rate responsive to the operation of said switch means after said output signal, the time period required to complete the charge of said capacitor at twice said one rate being a period of constant duration taken relative to the center of said pulse.

* * * * *